US008654541B2

(12) United States Patent
Robert et al.

(10) Patent No.: US 8,654,541 B2
(45) Date of Patent: Feb. 18, 2014

(54) THREE-DIMENSIONAL POWER ELECTRONICS PACKAGES

(75) Inventors: Brian Joseph Robert, Saint Clair Shores, MI (US); Ercan Mehmet Dede, Ann Arbor, MI (US); Serdar Hakki Yonak, Ann Arbor, MI (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 384 days.

(21) Appl. No.: 13/070,990

(22) Filed: Mar. 24, 2011

(65) Prior Publication Data

US 2012/0243192 A1 Sep. 27, 2012

(51) Int. Cl.
*H05K 7/00* (2006.01)

(52) U.S. Cl.
USPC ........... 361/780; 361/792; 361/767; 361/760; 361/799

(58) Field of Classification Search
USPC ......... 361/767, 780, 775, 790, 792, 760, 799; 257/713, 723, 796
See application file for complete search history.

(56) References Cited

U.S. PATENT DOCUMENTS

| | | | |
|---|---|---|---|
| 4,299,873 A * | 11/1981 | Ogihara et al. | 428/137 |
| 5,579,207 A | 11/1996 | Hayden et al. | |
| 5,621,243 A | 4/1997 | Baba et al. | |
| 5,655,290 A * | 8/1997 | Moresco et al. | 29/830 |
| 5,966,291 A * | 10/1999 | Baumel et al. | 361/707 |
| 6,221,769 B1 | 4/2001 | Dhong et al. | |
| 6,295,199 B1 | 9/2001 | Le Gouil | |
| 6,335,494 B1 * | 1/2002 | Gregor et al. | 174/261 |
| 6,355,950 B1 | 3/2002 | Livengood et al. | |
| 6,411,519 B2 * | 6/2002 | Asai et al. | 361/794 |
| 6,423,571 B2 | 7/2002 | Ogino et al. | |
| 6,495,454 B2 | 12/2002 | Livengood et al. | |
| 6,716,737 B2 | 4/2004 | Plas et al. | |
| 6,787,710 B2 * | 9/2004 | Uematsu et al. | 174/261 |
| 6,845,017 B2 * | 1/2005 | Ahmed et al. | 361/775 |
| 6,987,670 B2 * | 1/2006 | Ahmed et al. | 361/699 |
| 7,005,388 B1 | 2/2006 | Hopper et al. | |
| 7,057,274 B2 | 6/2006 | Heschel | |
| 7,217,370 B2 * | 5/2007 | Sugimoto et al. | 216/17 |
| 7,446,404 B2 | 11/2008 | Huang et al. | |
| 7,538,425 B2 | 5/2009 | Myers et al. | |

(Continued)

OTHER PUBLICATIONS

Office Action Dated Jun. 24, 2013 filed in U.S. Appl. No. 13/036,447.

*Primary Examiner* — Adrian S Wilson
*Assistant Examiner* — Abhishek Rathod
(74) *Attorney, Agent, or Firm* — Dinsmore & Shohl LLP

(57) ABSTRACT

Three-dimensional power electronics packages are disclosed. In one embodiment, a three-dimensional power electronics package includes a metalized substrate assembly, a first power electronics device, and a second power electronics device. The metalized substrate assembly includes an insulating dielectric substrate having a power via fully-extending through the insulating dielectric substrate, a first conductive layer on a first surface of the insulating dielectric substrate, and a second conductive layer on a second surface of the insulating dielectric substrate. The first conductive layer is electrically coupled to the second conductive layer by the power via. The first power electronics device is electrically coupled to the first conductive layer such that the first power electronics device is positioned in a first plane. The second power electronics device is electrically coupled to the second conductive layer such that the second power electronics device is positioned in a second plane parallel to the first plane.

18 Claims, 3 Drawing Sheets

(56) References Cited

U.S. PATENT DOCUMENTS

| | | |
|---|---|---|
| 7,612,449 B2 | 11/2009 | Gagne et al. |
| 7,648,900 B2 | 1/2010 | Kirby |
| 7,741,218 B2 | 6/2010 | Sparks et al. |
| 7,846,837 B2 | 12/2010 | Kuo |
| 8,247,699 B2 | 8/2012 | Shen |
| 8,411,442 B2 | 4/2013 | Meinel et al. |
| 2001/0046125 A1* | 11/2001 | Rehm et al. ............ 361/760 |
| 2003/0043556 A1* | 3/2003 | Sugimoto et al. ............ 361/760 |
| 2003/0053302 A1* | 3/2003 | Kelly et al. ............ 361/780 |
| 2003/0085055 A1* | 5/2003 | Skinner et al. ............ 174/255 |
| 2003/0222340 A1* | 12/2003 | Kondo et al. ............ 257/700 |
| 2005/0094381 A1* | 5/2005 | Imamura et al. ............ 361/750 |
| 2005/0100298 A1* | 5/2005 | Okubora et al. ............ 385/129 |
| 2006/0291177 A1* | 12/2006 | Choi et al. ............ 361/780 |
| 2007/0296065 A1 | 12/2007 | Yew et al. |
| 2009/0212397 A1 | 8/2009 | Tuttle |
| 2009/0231820 A1* | 9/2009 | Tanaka ............ 361/764 |
| 2009/0267183 A1 | 10/2009 | Temple et al. |
| 2009/0309212 A1 | 12/2009 | Shim et al. |
| 2010/0059865 A1 | 3/2010 | Low et al. |
| 2010/0072579 A1 | 3/2010 | Thies et al. |
| 2010/0096738 A1 | 4/2010 | Simmons-Matthews et al. |
| 2010/0127381 A1 | 5/2010 | Shin et al. |
| 2010/0130002 A1 | 5/2010 | Dao et al. |
| 2010/0155932 A1 | 6/2010 | Gambino et al. |
| 2010/0157640 A1* | 6/2010 | Azuma et al. ............ 363/132 |
| 2010/0178761 A1 | 7/2010 | Chen et al. |
| 2010/0187683 A1 | 7/2010 | Bakir et al. |
| 2010/0230818 A1 | 9/2010 | Birner et al. |
| 2010/0244189 A1 | 9/2010 | Klootwijk et al. |
| 2010/0258951 A1 | 10/2010 | Gabara |
| 2010/0264548 A1 | 10/2010 | Sanders et al. |
| 2010/0276786 A1 | 11/2010 | Cotte et al. |
| 2011/0011637 A1* | 1/2011 | Yoshinaga et al. ............ 174/262 |
| 2011/0013365 A1 | 1/2011 | Oota |
| 2011/0096496 A1* | 4/2011 | Doo et al. ............ 361/689 |
| 2012/0039039 A1* | 2/2012 | Nishikimi et al. ............ 361/689 |
| 2012/0063093 A1 | 3/2012 | Meinel et al. |
| 2012/0218714 A1* | 8/2012 | Robert ............ 361/713 |

\* cited by examiner

THREE-DIMENSIONAL POWER ELECTRONICS PACKAGES

TECHNICAL FIELD

The present specification generally relates to power electronics packages and, more particularly, to three-dimensional power electronics packages having power vias.

BACKGROUND

Power electronics devices, such as power diodes, power MOSFETs, IGBTs and the like, are utilized in high-current switching applications. For example, an inverter/converter circuit of an electric or hybrid-electric vehicle may utilize such power electronics devices to drive an electric motor to propel a vehicle. Because of the high-current, high-switching demands of the circuit, these power electronics devices may generate significant heat. Accordingly, the power electronics devices may be coupled to an insulated metalized substrate, such as active metal brazed, direct bonded copper, or direct bonded aluminum substrates, to aid in thermal management. The power electronics devices are typically mounted in a two-dimensional package, meaning that each power electronics device of the package is positioned on the same surface of the insulated metalized substrate. Control circuitry is provided on a separate printed circuit board and is connected to the power electronics devices by multiple wire bond or ribbon bond connections.

However, two-dimensional power electronics device package design requires a large package footprint, and requires extra components separate from the package, such as the control printed circuit board and wire bond or ribbon bond connections. Additionally, the further the control circuit is from the power electronics devices, the more electrical noise that may be created due to the high-frequency, high-current nature of such high power circuits.

Accordingly, a need exists for alternative power electronics packages that reduce the package footprint and components.

SUMMARY

In one embodiment, a three-dimensional power electronics package includes a metalized substrate assembly, a first power electronics device, and a second power electronics device. The metalized substrate assembly includes an insulating dielectric substrate having a power via fully extending through a thickness of the insulating dielectric substrate, a first conductive layer on a first surface of the insulating dielectric substrate, and a second conductive layer on a second surface of the insulating dielectric substrate. The first conductive layer is electrically coupled to the second conductive layer by the power via. The first power electronics device is electrically coupled to the first conductive layer such that the first power electronics device is positioned in a first plane. The second power electronics device is electrically coupled to the second conductive layer such that the second power electronics device is positioned in a second plane that is parallel to the first plane.

In another embodiment, a three-dimensional power electronics package includes a metalized substrate assembly, a first power electronics device, a second power electronics device, a control circuit, and a signal conductive region. The metalized substrate assembly includes an insulating dielectric substrate having a power via and a signal via fully extending through a thickness of the insulating dielectric substrate. The insulating dielectric substrate includes a material selected from the group consisting of alumina, aluminum nitride, silicon nitride, silicon carbide, and beryllium oxide. The metalized substrate further includes a first conductive layer on a first surface of the insulating dielectric substrate, and a second conductive layer on a second surface of the insulating dielectric substrate. The first conductive layer is electrically coupled to the second conductive layer by the power via. The first power electronics device is electrically coupled to the first conductive layer such that the first power electronics device is positioned in a first plane, and the second power electronics device is electrically coupled to the second conductive layer such that the second power electronics device is positioned in a second plane that is parallel to the first plane. The control circuit includes a plurality of electrical components coupled to the first surface of the insulating dielectric substrate. The signal conductive region is positioned on the second surface of the insulating dielectric substrate and is electrically isolated from the second conductive layer. The signal via electrically couples the control circuit to the signal conductive region.

In yet another embodiment, a three-dimensional power electronics package includes a top metalized substrate assembly, a first power terminal, a second power terminal, a bottom metalized substrate assembly, a first power electronics device, and a second power electronics device. The top metalized substrate assembly includes a top insulating dielectric substrate including a first voltage potential power via and a second voltage potential power via fully extending through a thickness of the top insulating dielectric substrate. The first voltage potential power via is associated with a first voltage potential and the second voltage potential power via is associated with a second voltage potential. The top metalized substrate assembly further includes a first conductive region and a second conductive region positioned on a first surface of the top insulating dielectric substrate, and a third conductive region and a fourth conductive region positioned on a second surface of the top insulating dielectric substrate. The first conductive region is associated with the first voltage potential and the second conductive region is associated with the second voltage potential. The third conductive region is associated with the first voltage potential and the fourth conductive region is associated with the second voltage potential. The second conductive region is electrically coupled to the fourth conductive region by the second voltage potential power via.

The first power terminal is electrically coupled to the first conductive region and is associated with the first voltage potential. The second power terminal is electrically coupled to the second conductive region and is associated with the second voltage potential.

The bottom metalized substrate assembly includes a bottom insulating dielectric substrate and a bottom conductive layer coupled to a first surface of the bottom insulating dielectric substrate such that the bottom conductive layer is electrically coupled to the fourth conductive region.

The first power electronics device includes a first voltage potential connection and a second voltage potential connection. The first power electronics device is coupled to the first conductive region of the top insulating dielectric substrate such that the first voltage potential connection of the first power electronics device is electrically coupled to the first power terminal and the second voltage potential connection of the first power electronics device is electrically coupled to the second power terminal. The second power electronics device includes a first voltage potential connection and a second voltage potential connection. The second power electronics device is coupled to the third conductive region and the bottom conductive layer such that the first voltage potential connection of the second power electronics device is electrically coupled to the first power terminal and the second voltage potential connection of the second power electronics device is electrically coupled to the second power terminal.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Figure 1:
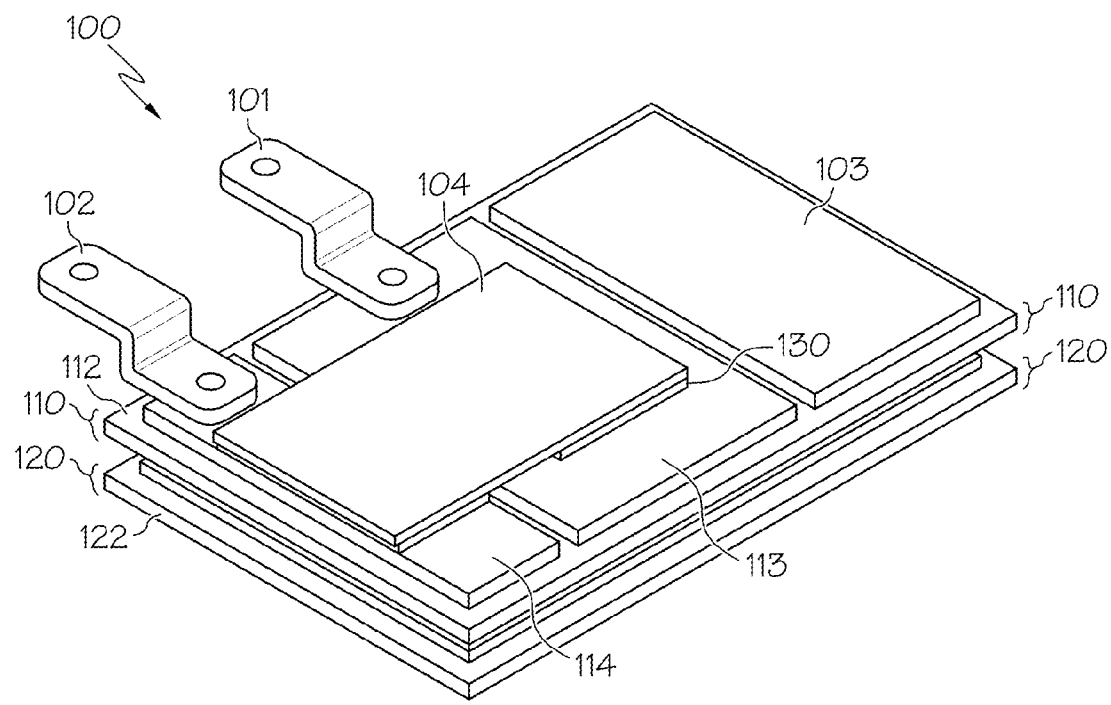
FIG. 1 schematically depicts a top perspective view of a three-dimensional power electronics package according to one or more embodiments shown and described herein.

FIG. 1 generally depicts one embodiment of a three-dimensional power electronics package in which power electronics devices are vertically stacked in multiple parallel planes rather then on a substrate in the same plane. Such a three-dimensional arrangement may reduce materials and the overall footprint of the power electronics package. Embodiments described herein generally achieve the three-dimensional arrangement by use of electrically conductive power vias through an insulating dielectric substrate of a metalized substrate assembly. The power vias may be utilized to create an electric path to electrically couple the stacked power electronics devices. In one embodiment, a three-dimensional power electronics device comprises a top metalized substrate assembly, a bottom metalized substrate assembly, a first power electronics device, and a second power electronics device. The first power electronics device is coupled to a top surface of the top metalized substrate assembly while the second power electronics device is sandwiched between the top and bottom metalized substrates. The two power electronics devices are electrically coupled by power vias that provide an electrical path. Various embodiments of three-dimensional power electronics packages will be described in detail below.

Figure 6:
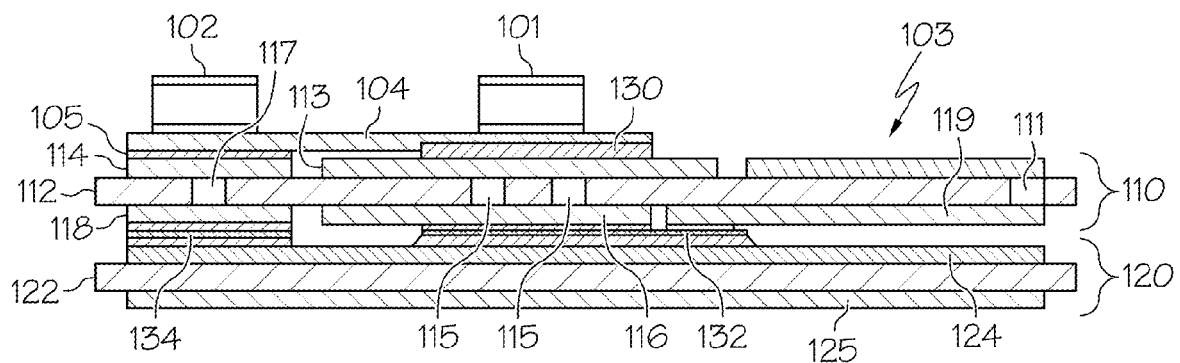
FIG. 6 schematically depicts a cross-section view of the three-dimensional power electronics package illustrated in FIG. 1 according to one or more embodiments shown and described herein.

Referring now to FIG. 1, a top perspective view of a three-dimensional power electronics device 100 according to one embodiment is illustrated. Generally, the three-dimensional power electronics package 100 comprises a top metalized substrate assembly 110, a bottom metalized substrate assembly 120, a control circuit 103, bus bar 104, power terminals 101 and 102, a first power electronics device 130, and a second power electronics device 132 (depicted in FIG. 6). As shown in FIGS. 1 and 6, the first power electronics device is positioned on a top surface of the top metalized substrate assembly 110 in a first plane, while the second power electronics device 132 is positioned between the top metalized substrate assembly 110 and the bottom metalized substrate assembly 120 in a second plane that is parallel to the first plane. The power electronics packages are three-dimensional because the power electronics devices are positioned in planes that are parallel to one another rather than being positioned within the same plane. It should be understood that the terms "top" and "bottom" are utilized here for ease of description, and that no positional limitations are intended. Accordingly, the three-dimensional power electronics device 100 may be oriented 90 degrees clockwise to the orientation shown in FIG. 1 and the top and bottom metalized substrate assemblies would no longer be located at the "top" and "bottom," respectively. It is noted that embodiments may include additional power electronics devices that are located in additional parallel planes.

The three-dimensional power electronics devices described herein may be incorporated into larger power systems, such as an electrical system for an electric or hybrid-electric vehicle, for example. The power electronics devices 130, 132 may be one or more power semiconductor devices that may include, without limitation, IGBTs, RC-IGBTs, MOSFETs, power MOSFETs, diodes, transistors, and/or combinations thereof. In one embodiment, the power electronics devices 130, 132 may be capable of switching current up to and beyond 200 A.

Figure 2:
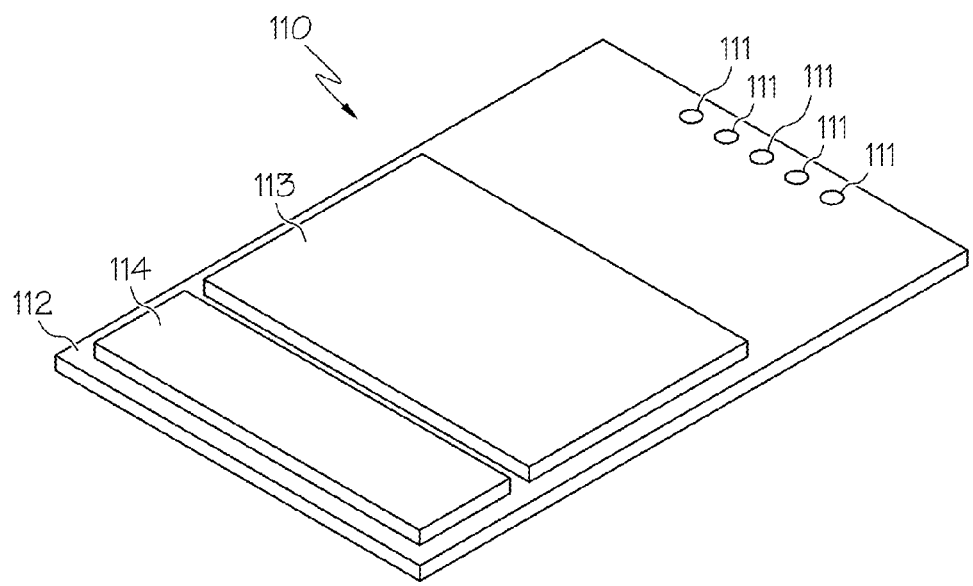
FIG. 2 schematically depicts a top perspective view of a top metalized substrate assembly according to one or more embodiments shown and described herein.
Figure 3:
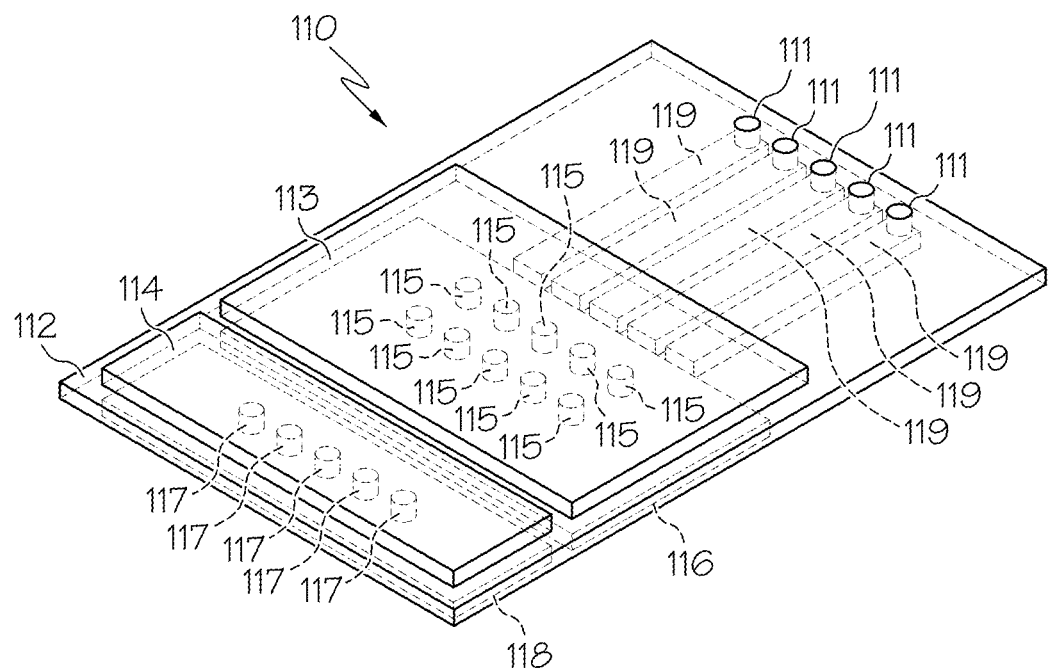
FIG. 3 schematically depicts a transparent top perspective view of the top metalized substrate assembly illustrated in FIG. 2 according to one or more embodiments shown and described herein.
Figure 4:
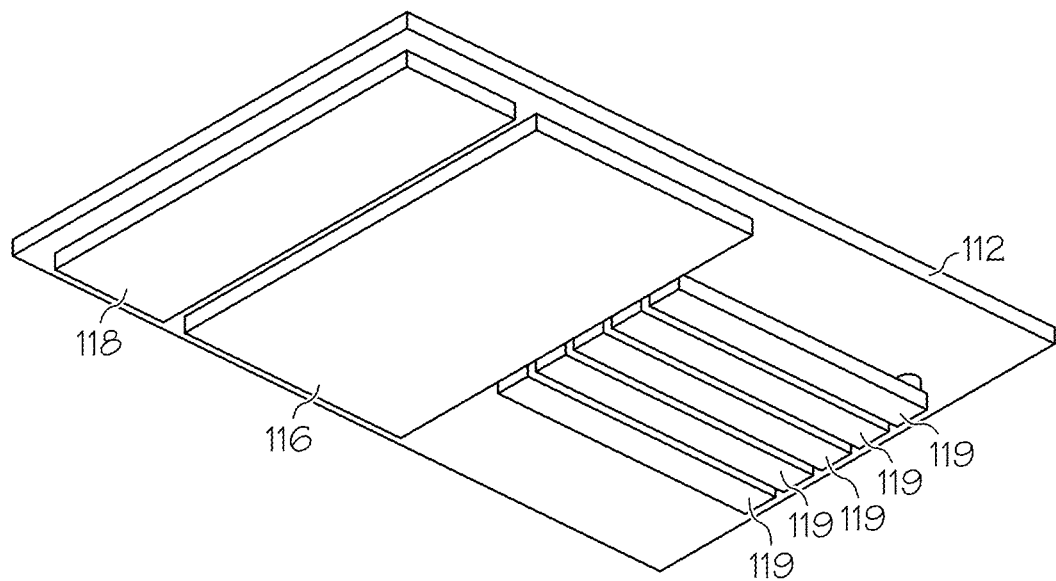
FIG. 4 schematically depicts a bottom perspective view of the top metalized substrate assembly illustrated in FIG. 2 according to one or more embodiments shown and described herein.

FIGS. 2-4 illustrate one embodiment of a top metalized substrate assembly 110. FIG. 2 is a top perspective view of a top metalized substrate assembly 110, FIG. 3 is a transparent, top perspective view of the top metalized substrate assembly 110 illustrated in FIG. 2, and FIG. 4 is a bottom perspective view of the top metalized substrate assembly 110 illustrated in FIG. 2.

The top metalized substrate assembly 110 may be configured as an active metal brazed or direct bonded substrate assembly, such as a direct bonded aluminum assembly or a direct bonded copper assembly, for example. The illustrated top metalized substrate assembly 110 comprises a top insulating dielectric substrate 112 sandwiched between a first conductive layer comprising a first conductive region 113 and a second conductive region 114 and a second conductive layer comprising a third conductive region 116 and a fourth conductive region 118. The first conductive region 113 is electrically isolated from the second conductive region 114, and the third conductive region 116 is electrically isolated from the fourth conductive region 118. Alternatively, the first and second conductive layers may have more or fewer regions. For example, the first and second conductive layers may each consist of a single region in some embodiments.

In embodiments that have a control circuit coupled to the top metalized substrate assembly 110, the top metalized substrate assembly 110 may also comprise one or more signal conductive regions 119 on the same surface of the insulating dielectric substrate 112 as the third and fourth conductive regions 116, 118. As described in more detail below, the signal conductive regions 119 may provide control or feedback signals between the control circuit (e.g., control circuit 103 illustrated as a block in FIG. 1) and the second power electronics device 132 (see FIG. 6). For example, one or more of the signal conductive regions 119 may pass control signals to control the power electronics devices 130 and 132 (e.g., gate control signals), while one or more of the signal conductive regions 119 may pass feedback sensing signals, such as voltage, current, and temperature signals, to the control circuit 103.

The top insulating dielectric substrate 112 may comprise a dielectric material that is electrically isolating and thermally conductive. Exemplary materials may include alumina, aluminum nitride, silicon nitride, silicon carbide, and beryllium oxide. Other materials that are electrically isolating and thermally conductive may also be utilized. The thickness and overall dimensions of the top insulating dielectric substrate 112 may depend on the particular application in which the three-dimensional power electronics device 100 is utilized. In one embodiment, the top insulating dielectric substrate 112 has a thickness of between about 0.1 mm and about 1.0 mm.

The first, second, third, and fourth conductive regions 113, 114, 116, 118 may comprise an electrically conductive material (e.g., copper or aluminum) that is directly bonded to a first and second surface of the top insulating dielectric substrate. The signal conductive regions 119 may also be made of an electrically conductive material such as copper or aluminum. As described in more detail below, the conductive regions 113, 114, 116, 118, and 119 provide electrical coupling with the power electronics devices present in the three-dimensional power electronics package 100, as well as provide a means for dissipating operational heat-flux generated by the power electronics devices (e.g., first power electronics device 130 and second power electronics device 132). It is noted that the size and shape of the various conductive regions may depend on the size and shape of the power electronics devices included in the three-dimensional power electronics package 100.

The first conductive region 113 has a first voltage potential associated therewith (e.g., a positive voltage potential) and the second conductive region 114 has a second voltage potential associated therewith (e.g., a ground voltage potential) when the three-dimensional power electronics package 100 is assembled and coupled to an electrical system. Through the use of power vias described below, the third conductive region 116 is associated with the first voltage potential and the fourth conductive region 118 is associated with the second voltage potential.

Referring specifically to FIG. 3, the top metalized substrate assembly 110 further comprises several electrically conductive vias that fully extend through the top insulating dielectric substrate 112. In the embodiment depicted in FIG. 3, the top metalized substrate assembly 110 comprises several first voltage potential vias 115 positioned between the first conductive region 113 and the third conductive region 116, several second potential vias 117 positioned between the second conductive region 114 and the fourth conductive region 118, and several signal vias 111 positioned proximate the signal conductive regions 119. Although the vias are illustrated as being cylindrical in shape, other geometric shapes may be utilized. The number of first voltage potential vias 115, second potential vias 117, and signal vias 111 may vary and depend on the particular application. For example, in one embodiment, only one first voltage potential via 115 and only one second potential via 117 may be used.

The vias 111, 115, 117 are used to pass electrical power and/or electrical signals through the top insulating dielectric substrate 112. The first voltage potential vias 115 electrically couple the first conductive region 113 to the third conductive region 116, such that the first conductive region 113 and the third conductive region 116 both have the first voltage potential when coupled to a power source. The second voltage potential vias 117 electrically couple the second conductive region 114 to the fourth conductive region 118 such that the second conductive region 114 and the fourth conductive region 118 both have the second voltage potential when coupled to a power source.

In one embodiment, the vias 111, 115, 117 are fabricated by laser drilling holes through the thickness of the top insulating dielectric substrate 112. Depending on the thickness of the top insulating dielectric substrate 112 as well as the desired diameter of the vias, mechanical drilling may also be used to form the holes. The holes may then be filled with an electrically conductive material such that electrical current may be passed through the vias 111, 115, 117. In one embodiment, electrically conductive inserts are positioned within the drilled holes. In another embodiment, a solder material is filled into the holes. In yet another embodiment, both electrically conductive inserts and solder material are utilized (e.g., cylindrical tubes filled with solder). Any number of methods may be utilized to create the electrically conductive vias 111, 115, 117.

Figure 5:
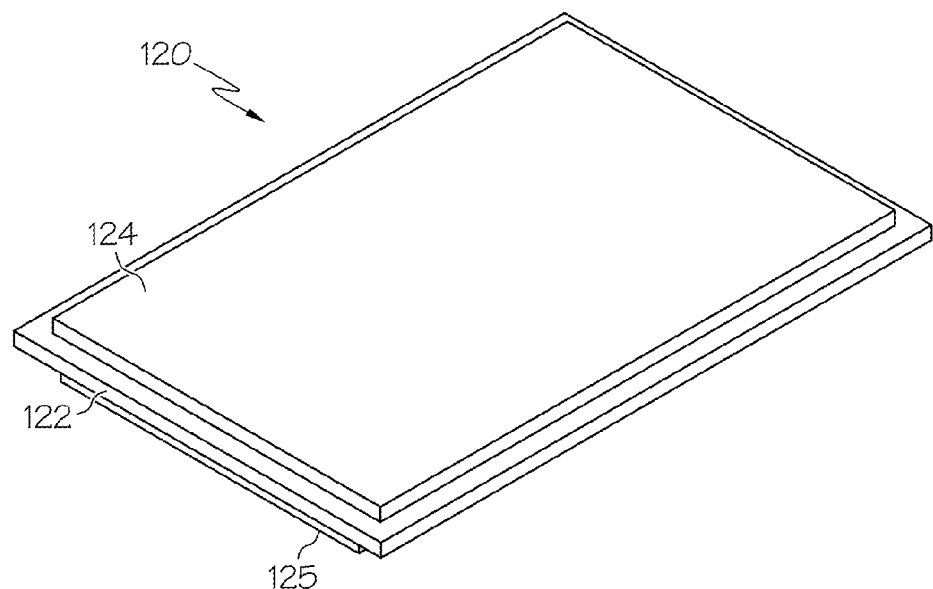
FIG. 5 schematically depicts a top perspective view of a bottom metalized substrate assembly according to one or more embodiments shown and described herein.

Some embodiments may also include a bottom metalized substrate assembly. FIG. 5 illustrates a top view of the bottom metalized substrate assembly 120 illustrated in FIG. 1. Like the top metalized substrate assembly 110 described above, the bottom metalized substrate assembly 120 may comprise an active metal brazed substrate (e.g., Al or Cu), a direct bonded aluminum substrate or a direct bonded copper substrate. The illustrated bottom metalized substrate assembly 120 comprises a bottom insulating dielectric substrate 122, a first bottom conductive layer 124 and a second bottom conductive layer 125. The second bottom conductive layer 125 may be utilized to thermally couple the three-dimensional power electronics package 100 to a cooling structure, such as a heat sink or a liquid-based cooler assembly. Some embodiments may only have a single bottom conductive layer (e.g., first bottom conductive layer 124). The size and shape of the first bottom conductive layer 124 and the second bottom conductive layer 125 may depend on the particular application of the three-dimensional power electronics package.

In alternative embodiments, the three-dimensional power electronics package 100 may not comprise a bottom metalized substrate assembly 120 but rather a sheet of an electrically conductive material, such as copper or aluminum. In yet another embodiment, the three-dimensional power electronics package may not include a bottom metalized substrate assembly 120 or a sheet of electrically conductive material such that the second power electronics device 132 and the fourth conductive region 118 are directly coupled to an electrically conductive surface of a cooling structure (not shown).

Referring to both FIGS. 1 and 6, a full three-dimensional power electronics package 100 according to one embodiment will now be described. The first power electronics device 130, which may comprise a power diode, for example, is electrically coupled to the first conductive region 113 of the top metalized substrate assembly 110 at a first voltage potential connection (e.g., a bottom surface of the first power electronics device). The top surface of the first power electronics device 130 acts as a second voltage potential connection, and is electrically coupled to the bus bar 104, which is further electrically coupled to the second conductive region 114 (by way of a first electrically conductive shim 105) and the second power terminal 102. The first power electronics device 130 may be electrically coupled to first conductive region 113 and the bus bar 104 by a variety of bonding techniques, such as soldering or brazing, for example. As illustrated in FIG. 6, the bus bar 104 may have a notch that is configured to mate with the top surface of the first power electronics device 130. The optional first electrically conductive shim 105 may be made of aluminum or copper, for example, and may be provided to compensate for the height of the first power electronics device. Alternatively, the first electrically conductive shim 105 may comprise a layer of solder.

In one embodiment, the first power terminal 101 is coupled to the first voltage potential of a power source, such as a battery (not shown), and the second power terminal 102 is coupled to the second voltage potential of the power source. Accordingly, the first power electronics device 130 is electrically coupled to first voltage potential by way of the first power terminal 101 and the first conductive region 113, and to the second voltage potential by way of the second power terminal 102, the second conductive region 114, the first electrically conductive shim 105, and the bus bar 104. The first and second power terminals 101, 102 may be configured as any type of electrical connector, and their configuration may depend on the particular application in which the three-dimensional power electronics package 100 is implemented.

Referring specifically now to FIG. 6, the second power electronics device 132 is sandwiched between the top metalized substrate assembly 110 and the bottom metalized substrate assembly 120. A first voltage potential connection of the second power electronics device 132 (e.g., a top surface of the second power electronics device 132) is electrically coupled to the third conductive region 116, and a second voltage potential connection of the second power electronics device 132 (e.g., a bottom surface of the second power electronics device 132) is electrically coupled to the first bottom conductive layer 124. The electrical connections between the second power electronics device 132 and the third conductive region 116 and the first bottom conductive layer 124 may be effectuated by soldering or brazing, for example.

A second electrically conductive shim 134 may be positioned between the fourth conductive region 118 and the first bottom conductive layer 124 to compensate for the height of the second power electronics device 132 and to electrically couple the fourth conductive region 118 to the first bottom conductive layer 124. The second electrically conductive shim 134 may comprise a metal material, such a copper or aluminum, or a layer of solder.

As described above, the first voltage potential vias 115 electrically couple the first conductive region 113 to the third conductive region 116, and the second voltage potential vias 117 electrically couple the second conductive region 114 to the fourth conductive region 118. Accordingly, the second power electronics device 132 is electrically coupled to the first voltage potential by way of the first power terminal 101, the first conductive region 113, the first voltage potential vias 115, and the third conductive region 116. The second power electronics device is electrically coupled to the second voltage potential by way of the second power terminal 102, the first electrically conductive shim 105, the second conductive region 114, the second voltage potential vias 117, the fourth conductive region 118, the second electrically conductive shim 134, and the first bottom conductive layer 124.

In one embodiment, as illustrated in FIGS. 1 and 6, the three-dimensional power electronics package 100 may also include the control circuit 103 that may be utilized to control the power electronics devices 130, 132. By coupling the control circuit, which may include a plurality of individual electrical components (not shown), to the top insulating dielectric substrate 112, a compact, fully integrated electronics package may be realized. As described above, the control input and outputs of the second power electronics device 132 may be electrically coupled to the signal conductive region or regions 119 to enable electrical control signals to pass to and from the second power electronics device 132. The signal vias 111 allow the electrically control signals to pass through the top insulating dielectric substrate 112 and reach the second power electronics device 132.

The embodiments described herein may be coupled together, as well as coupled to other electronics devices to form an electrical system. As an example and not a limitation, the three-dimensional power electronics packages may be coupled together as an inverter/converter circuit for an electric or hybrid-electric vehicle. Embodiments may also be utilized in other high-power applications.

It should now be understood that embodiments described herein are directed to three-dimensional power electronics packages that utilize a stacked, three-dimensional design as well as electrically conductive vias to provide a compact design to enable miniaturization and modularity. Embodiments have a relatively small overall footprint compared with traditional, two-dimensional designs. The through-substrate vias may eliminate the need for multiple wire bond or ribbon connections, thereby reducing cost. Embodiments may be further coupled to cooling structures.

It is noted that the term "substantially" may be utilized herein to represent the inherent degree of uncertainty that may be attributed to any quantitative comparison, value, measurement, or other representation. This term is also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A three-dimensional power electronics package comprising:
   a metalized substrate assembly comprising:
      an insulating dielectric substrate comprising a first power via and a second power via fully extending through a thickness of the insulating dielectric substrate;
      a first conductive layer on a first surface of the insulating dielectric substrate, the first conductive layer comprising a first conductive region associated with a first voltage potential, and a second conductive region associated with a second voltage potential; and
      a second conductive layer on a second surface of the insulating dielectric substrate, the second conductive layer comprising a third conductive region associated with the first voltage potential, and a fourth conductive region associated with the second voltage potential, wherein the first power via electrically couples the first conductive region with the third conductive region, and the second power via electrically couples the second conductive region with the fourth conductive region;
   a first power electronics device electrically coupled to the first conductive layer such that the first power electronics device is positioned in a first plane; and a second power electronics device electrically coupled to the second conductive layer such that the second power electronics device is positioned in a second plane that is parallel to the first plane.

2. The three-dimensional power electronics package of claim 1, wherein the insulating dielectric substrate comprises a material selected from the group consisting of: alumina, aluminum nitride, silicon nitride, silicon carbide, and beryllium oxide.

3. The three-dimensional power electronics package of claim 1, further comprising:
   a control circuit comprising a plurality of electrical components coupled to the first surface of the insulating dielectric substrate; and
   a signal conductive region on the second surface of the insulating dielectric substrate, wherein the signal conductive region is electrically isolated from the second conductive layer, and the insulating dielectric substrate further comprises a signal via fully extending through the thickness of the insulating dielectric substrate that electrically couples the control circuit to the signal conductive region.

4. The three-dimensional power electronics package of claim 3, wherein the signal conductive region is electrical coupled to the second power electronics device.

5. The three-dimensional power electronics package of claim 1, further comprising a bottom metalized substrate assembly comprising a bottom insulating dielectric substrate and a bottom conductive layer on a first surface of the bottom insulating dielectric substrate, wherein the second power electronics device is further electrically coupled to the bottom conductive layer.

6. The three-dimensional power electronics package of claim 1, wherein:
   the first power electronics device is electrically coupled to the first conductive region; and
   the second power electronics device is electrically coupled to the third conductive region.

7. The three-dimensional power electronics package of claim 1, wherein:
   the first power electronics device and the second power electronics device each comprise a first voltage potential connection and a second voltage potential connection;
   the first power electronics device is electrically coupled to the first conductive region at the first voltage potential connection of the first power electronics device;
   the second power electronics device is electrically coupled to the third conductive region at the first voltage potential connection of the second power electronics device; and
   the three-dimensional power electronics package further comprises:
      a first power terminal electrically coupled to the first conductive region, the first power terminal associated with the first voltage potential;
      a first electrically conductive shim coupled to the second conductive region;
      a second power terminal electrically coupled to the second conductive region, the second power terminal associated with the second voltage potential; and
      a bus bar coupled to the first electrically conductive shim and the second voltage potential connection of the first power electronics device such that the bus bar electrically couples the second voltage potential connection of the first power electronics device to the second power terminal.

8. The three-dimensional power electronics package of claim 7, further comprising a bottom metalized substrate assembly comprising a bottom insulating dielectric substrate and a bottom conductive layer on a first surface of the bottom insulating dielectric substrate, wherein the second voltage potential connection of the second power electronics device is electrically coupled to the bottom conductive layer.

9. The three-dimensional power electronics package of claim 8, further comprising a second electrically conductive shim electrically coupled to the bottom conductive layer and the fourth conductive region.

10. The three-dimensional power electronics package of claim 9, wherein:
    the first conductive region, the power via, and the third conductive region are associated with the first voltage potential; and
    the second power terminal, the bus bar, the second conductive region, the second voltage potential via, the second electrically conductive shim, and the bottom conductive layer are associated with the second voltage potential.

11. A three-dimensional power electronics package comprising:
    a metalized substrate assembly comprising:
        an insulating dielectric substrate comprising a first power via and a second power via and a signal via fully extending through a thickness of the insulating dielectric substrate, wherein the insulating dielectric substrate comprises a material selected from the group consisting of alumina, aluminum nitride, silicon nitride, silicon carbide, and beryllium oxide;
        a first conductive layer on a first surface of the insulating dielectric substrate, the first conductive layer comprising a first conductive region associated with a first voltage potential, and a second conductive region associated with a second voltage potential; and
        a second conductive layer on a second surface of the insulating dielectric substrate, the second conductive layer comprising a third conductive region associated with the first voltage potential, and a fourth conductive region associated with the second voltage potential, wherein the first power via electrically couples the first conductive region with the third conductive region and the second power via electrically couples the second conductive region with the fourth conductive region;
    a first power electronics device electrically coupled to the first conductive layer such that the first power electronics device is positioned in a first plane;
    a second power electronics device electrically coupled to the second conductive layer such that the second power electronics device is positioned in a second plane that is parallel to the first plane;
    a control circuit comprising a plurality of electrical components coupled to the first surface of the insulating dielectric substrate; and
    a signal conductive region on the second surface of the insulating dielectric substrate, wherein the signal conductive region is electrically isolated from the second conductive layer and the signal via electrically couples the control circuit to the signal conductive region.

12. The three-dimensional power electronics package of claim 11, wherein:
    the first power electronics device and the second power electronics device each comprise a first voltage potential connection and a second voltage potential connection;

the first power electronics device is electrically coupled to the first conductive region at the first voltage potential connection of the first power electronics device;

the second power electronics device is electrically coupled to the third conductive region at the first voltage potential connection of the second power electronics device; and the three-dimensional power electronics package further comprises:
- a first power terminal electrically coupled to the first conductive region, the first power terminal associated with the first voltage potential;
- a first electrically conductive shim coupled to the second conductive region;
- a second power terminal electrically coupled to the second conductive region, the second power terminal associated with the second voltage potential; and
- a bus bar coupled to the first electrically conductive shim and the second voltage potential connection of the first power electronics device such that the bus bar electrically couples the second voltage potential connection of the first power electronics device to the second power terminal.

13. The three-dimensional power electronics package of claim 12, further comprising a bottom metalized substrate assembly comprising a bottom insulating dielectric substrate and a bottom conductive layer on a first surface of the bottom insulating dielectric substrate, wherein the second voltage potential connection of the second power electronics device is electrically coupled to the bottom conductive layer.

14. A three-dimensional power electronics package comprising:
- a top metalized substrate assembly comprising:
  - a top insulating dielectric substrate comprising:
    - a first voltage potential power via fully extending through a thickness of the top insulating dielectric substrate, wherein the first voltage potential power via is associated with a first voltage potential; and
    - a second voltage potential power via fully extending through the thickness of the top insulating dielectric substrate, wherein the second voltage potential power via is associated with a second voltage potential;
  - a first conductive region and a second conductive region positioned on a first surface of the top insulating dielectric substrate, wherein the first conductive region is associated with the first voltage potential and the second conductive region is associated with the second voltage potential; and
  - a third conductive region and a fourth conductive region positioned on a second surface of the top insulating dielectric substrate, wherein:
    - the third conductive region is associated with the first voltage potential and the fourth conductive region is associated with the second voltage potential;
    - the first conductive region is electrically coupled to the third conductive region by the first voltage potential power via; and
    - the second conductive region is electrically coupled to the fourth conductive region by the second voltage potential power via;
- a first power terminal electrically coupled to the first conductive region, wherein the first power terminal is associated with the first voltage potential;
- a second power terminal electrically coupled to the second conductive region, wherein the second power terminal is associated with the second voltage potential;
- a bottom metalized substrate assembly comprising:
  - a bottom insulating dielectric substrate; and
  - a bottom conductive layer coupled to a first surface of the bottom insulating dielectric substrate, wherein the bottom conductive layer is electrically coupled to the fourth conductive region;
- a first power electronics device comprising a first voltage potential connection and a second voltage potential connection, wherein the first power electronics device is coupled to the first conductive region of the top insulating dielectric substrate such that the first voltage potential connection of the first power electronics device is electrically coupled to the first power terminal and the second voltage potential connection of the first power electronics device is electrically coupled to the second power terminal; and
- a second power electronics device comprising a first voltage potential connection and a second voltage potential connection, wherein the second power electronics device is coupled to the third conductive region and the bottom conductive layer such that the first voltage potential connection of the second power electronics device is electrically coupled to the first power terminal and the second voltage potential connection of the second power electronics device is electrically coupled to the second power terminal.

15. The three-dimensional power electronics package of claim 14, further comprising:
- a first electrically conductive shim coupled to the second conductive region;
- a second electrically conductive shim positioned between the fourth conductive region and the bottom conductive layer; and
- a bus bar coupled to the second electrically conductive shim and the second voltage potential connection of the first power electronics device, wherein the bus bar electrically couples the second voltage potential connection of the first power electronics device to the second power terminal.

16. The three-dimensional power electronics package of claim 14, further comprising:
- a control circuit comprising a plurality of electrical components coupled to the first surface of the top insulating dielectric substrate; and
- a signal conductive region on the second surface of the top insulating dielectric substrate, wherein the top insulating dielectric substrate further comprises a signal via fully extending through the thickness of the top insulating dielectric substrate that electrically couples the control circuit to the signal conductive region.

17. The three-dimensional power electronics package of claim 16, wherein the signal conductive region is electrically coupled to the second power electronics device.

18. The three-dimensional power electronics package of claim 14 wherein the top insulating dielectric substrate and the bottom insulating dielectric substrate comprise a material selected from the group consisting of alumina, aluminum nitride, silicon nitride, silicon carbide, and beryllium oxide.

* * * * *